(12) United States Patent
Harari et al.

(10) Patent No.: US 11,069,696 B2
(45) Date of Patent: Jul. 20, 2021

(54) DEVICE STRUCTURE FOR A 3-DIMENSIONAL NOR MEMORY ARRAY AND METHODS FOR IMPROVED ERASE OPERATIONS APPLIED THERETO

(71) Applicant: Sunrise Memory Corporation, Los Gatos, CA (US)

(72) Inventors: Eli Harari, Saratoga, CA (US); Raul Adrian Cernea, Santa Clara, CA (US); George Samachisa, Atherton, CA (US); Wu-Yi Henry Chien, San Jose, CA (US)

(73) Assignee: SUNRISE MEMORY CORPORATION, Fremont, CA (US)

( * ) Notice: Subject to any disclaimer, the term of this patent is extended or adjusted under 35 U.S.C. 154(b) by 0 days.

(21) Appl. No.: 16/509,282

(22) Filed: Jul. 11, 2019

(65) Prior Publication Data
US 2020/0051990 A1    Feb. 13, 2020

Related U.S. Application Data

(60) Provisional application No. 62/697,060, filed on Jul. 12, 2018.

(51) Int. Cl.
*H01L 27/112*     (2006.01)
*H01L 27/11556*   (2017.01)
(Continued)

(52) U.S. Cl.
CPC .... *H01L 27/11556* (2013.01); *G11C 11/5635* (2013.01); *G11C 16/0416* (2013.01);
(Continued)

(58) Field of Classification Search
CPC ......... H01L 27/11556; H01L 27/11582; H01L 27/1214; H01L 27/0688; H01L 29/78642;
(Continued)

(56) References Cited

U.S. PATENT DOCUMENTS 5,656,842 A * 8/1997 Iwamatsu ............. H01L 27/088
                                                    257/329
5,789,776 A    8/1998 Lancaster et al.
(Continued)

FOREIGN PATENT DOCUMENTS

KR    20120085591 A1    8/2012
KR    20120085603 A     8/2012

OTHER PUBLICATIONS

"European Search Report, EP 16852238.1", dated Mar. 28, 2019.
(Continued)

*Primary Examiner* — Bitew A Dinke
(74) *Attorney, Agent, or Firm* — Edward C. Kwok; VLP Law Group, LLP

(57) ABSTRACT

A thin-film storage transistor includes (a) first and second polysilicon layers of a first conductivity serving, respectively, as a source terminal and a drain terminal of the thin-film storage transistor; (b) a third polysilicon layer of a second conductivity adjacent the first and second polysilicon layers, serving as a channel region of the thin-film storage transistor; (c) a conductor serving as a gate terminal of the thin-film storage transistor; and (d) a charge-trapping region between the conductor and third polysilicon layer, wherein a fourth body layer polysilicon of the second conductivity is included to provide an alternative source of free charge careers to accelerate device operation.

38 Claims, 7 Drawing Sheets

Embodiments to provide holes to depleted P-channel to facilitate efficient erase operations

(51) Int. Cl.
  *H01L 27/11582* (2017.01)
  *G11C 16/04* (2006.01)
  *H01L 27/12* (2006.01)
  *G11C 11/56* (2006.01)
  *H01L 27/06* (2006.01)

(52) U.S. Cl.
  CPC ...... *G11C 16/0466* (2013.01); *H01L 27/0688* (2013.01); *H01L 27/11582* (2013.01); *H01L 27/1214* (2013.01)

(58) Field of Classification Search
  CPC ........... H01L 21/8221; H01L 27/11273; H01L 29/78618; H01L 29/0895; H01L 29/966742; H01L 21/823885; H01L 27/11553; H01L 27/1158; H01L 27/2454
  See application file for complete search history.

(56) References Cited

U.S. PATENT DOCUMENTS

| | | | |
|---|---|---|---|
| 6,107,133 A * | 8/2000 | Furukawa | H01L 27/10867 257/E21.652 |
| 6,118,171 A * | 9/2000 | Davies | H01L 29/732 257/586 |
| 6,434,053 B1 | 8/2002 | Fujiwara | |
| 6,580,124 B1 | 6/2003 | Cleeves et al. | |
| 6,744,094 B2 | 6/2004 | Forbes | |
| 6,873,004 B1 | 3/2005 | Han et al. | |
| 6,946,703 B2 | 9/2005 | Ryu et al. | |
| 7,489,002 B2 * | 2/2009 | Forbes | H01L 27/10823 257/301 |
| 7,524,725 B2 * | 4/2009 | Chung | H01L 29/66666 438/268 |
| 7,542,348 B1 | 6/2009 | Kim | |
| 8,139,418 B2 * | 3/2012 | Carman | G11C 7/00 365/185.18 |
| 8,395,942 B2 | 3/2013 | Samachisa et al. | |
| 8,630,114 B2 | 1/2014 | Lue | |
| 9,190,293 B2 | 11/2015 | Wang et al. | |
| 9,202,694 B2 * | 12/2015 | Konevecki | H01L 27/2436 |
| 9,230,985 B1 * | 1/2016 | Wu | H01L 29/66742 |
| 9,412,752 B1 | 8/2016 | Yeh et al. | |
| 9,748,172 B2 | 8/2017 | Takaki | |
| 9,892,800 B2 | 2/2018 | Harari | |
| 10,074,667 B1 | 9/2018 | Higashi | |
| 10,121,553 B2 | 11/2018 | Harari | |
| 10,254,968 B1 | 4/2019 | Gazit et al. | |
| 10,373,956 B2 * | 8/2019 | Gupta | H01L 21/02381 |
| 2001/0030340 A1 | 10/2001 | Fujiwara | |
| 2001/0053092 A1 | 12/2001 | Kosaka et al. | |
| 2002/0012271 A1 | 1/2002 | Forbes | |
| 2002/0028541 A1 * | 3/2002 | Lee | H01L 27/11556 438/149 |
| 2002/0051378 A1 | 5/2002 | Ohsawa | |
| 2003/0038318 A1 | 2/2003 | Forbes | |
| 2004/0246807 A1 | 12/2004 | Lee | |
| 2004/0262681 A1 * | 12/2004 | Masuoka | H01L 29/78642 257/335 |
| 2004/0264247 A1 | 12/2004 | Kim | |
| 2005/0128815 A1 | 6/2005 | Ishikawa et al. | |
| 2005/0280061 A1 * | 12/2005 | Lee | H01L 24/83 257/296 |
| 2006/0155921 A1 | 7/2006 | Gorobets et al. | |
| 2007/0134876 A1 | 6/2007 | Lai et al. | |
| 2008/0239812 A1 | 10/2008 | Naofumi et al. | |
| 2009/0057722 A1 * | 3/2009 | Masuoka | H01L 27/092 257/207 |
| 2009/0157946 A1 | 6/2009 | Arya | |
| 2009/0237996 A1 | 9/2009 | Kirsch et al. | |
| 2009/0279360 A1 | 11/2009 | Peter et al. | |
| 2009/0316487 A1 | 12/2009 | Lee et al. | |
| 2010/0124116 A1 | 5/2010 | Takashi et al. | |
| 2010/0207172 A1 * | 8/2010 | Masuoka | H01L 29/78642 257/255 |
| 2011/0115011 A1 * | 5/2011 | Masuoka | H01L 29/0657 257/314 |
| 2011/0208905 A1 | 8/2011 | Shaeffer et al. | |
| 2012/0182801 A1 | 7/2012 | Lue | |
| 2012/0243314 A1 | 9/2012 | Takashi | |
| 2012/0307568 A1 * | 12/2012 | Banna | H01L 27/11568 365/185.28 |
| 2014/0015036 A1 * | 1/2014 | Fursin | H01L 29/7828 257/329 |
| 2014/0117366 A1 * | 5/2014 | Saitoh | H01L 27/088 257/64 |
| 2014/0151774 A1 | 6/2014 | Rhie | |
| 2014/0247674 A1 * | 9/2014 | Karda | G11C 11/40 365/189.011 |
| 2014/0340952 A1 * | 11/2014 | Ramaswamy | G11C 11/223 365/51 |
| 2015/0054507 A1 | 2/2015 | Gulaka et al. | |
| 2015/0249143 A1 * | 9/2015 | Sano | H01L 27/11582 257/66 |
| 2016/0086970 A1 * | 3/2016 | Peng | H01L 27/11565 257/324 |
| 2016/0225860 A1 * | 8/2016 | Karda | H01L 29/516 |
| 2016/0314042 A1 | 10/2016 | Plants | |
| 2017/0092370 A1 * | 3/2017 | Harari | G11C 11/5635 |
| 2017/0092371 A1 * | 3/2017 | Harari | G11C 16/10 |
| 2017/0148517 A1 | 5/2017 | Harari | |
| 2018/0269229 A1 | 9/2018 | Or-Bach et al. | |
| 2019/0157296 A1 * | 5/2019 | Harari | H01L 29/4908 |
| 2019/0259769 A1 * | 8/2019 | Karda | H01L 21/823885 |
| 2019/0348424 A1 * | 11/2019 | Karda | H01L 29/78391 |
| 2019/0370117 A1 | 12/2019 | Fruchtman et al. | |
| 2020/0098738 A1 * | 3/2020 | Hemer | H01L 27/0688 |
| 2020/0258897 A1 * | 8/2020 | Yan | H01L 23/528 |

OTHER PUBLICATIONS

"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"EP Extended Search Report EP168690149.3", dated Oct. 18, 2019.
"European Search Report, EP17844550.8", dated Aug. 12, 2020, 11 pages.
"Notification of Reasons for Refusal, Japanese Patent Application 2018-527740", (English translation), dated Nov. 4, 2020, 8 pages.

* cited by examiner

500

502-7 { N+ — 523-7
SAC 1 (522)
N+ — 521-7
— 524-7

ISL (503-7)

502-6 { N+ — 523-6
SAC 1 (522)
N+ — 521-6
— 524-6

⋮

502-1 { N+ — 523-1
SAC 1 (522)
N+ — 521-1
— 524-1

ISL (503-1)

502-0 { N+ — 523-0
SAC 1 (522)
N+ — 521-0
— 524-0

ISL (503-0)

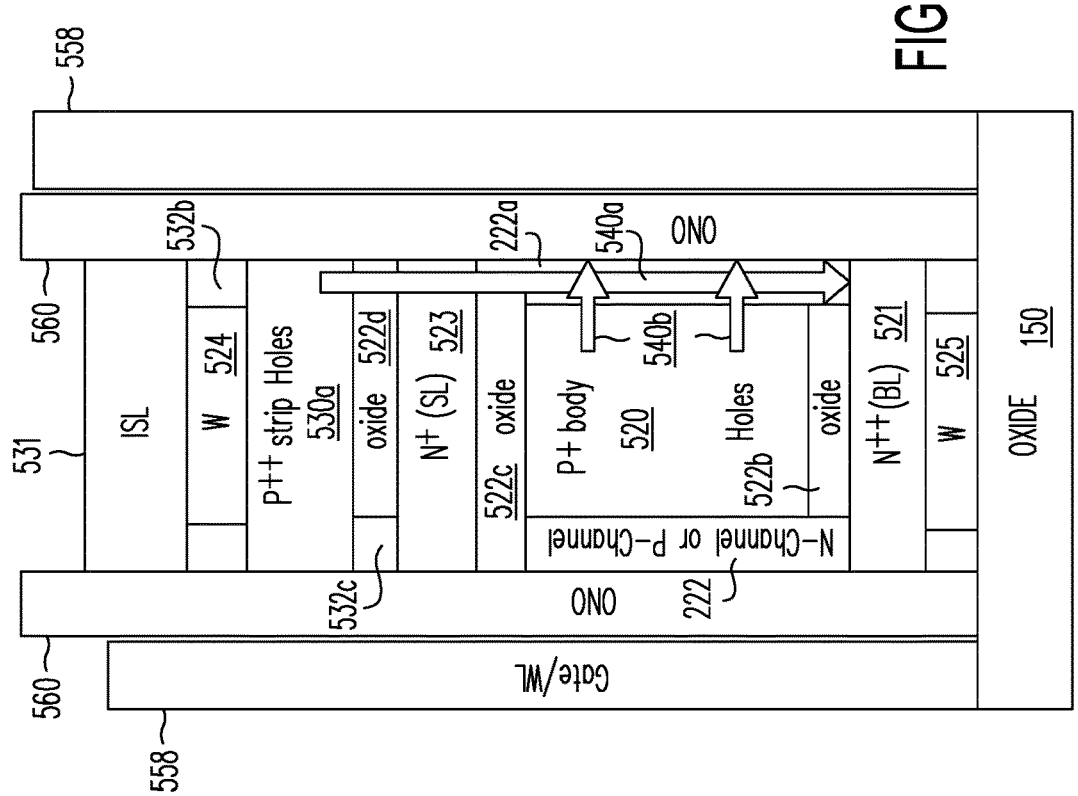
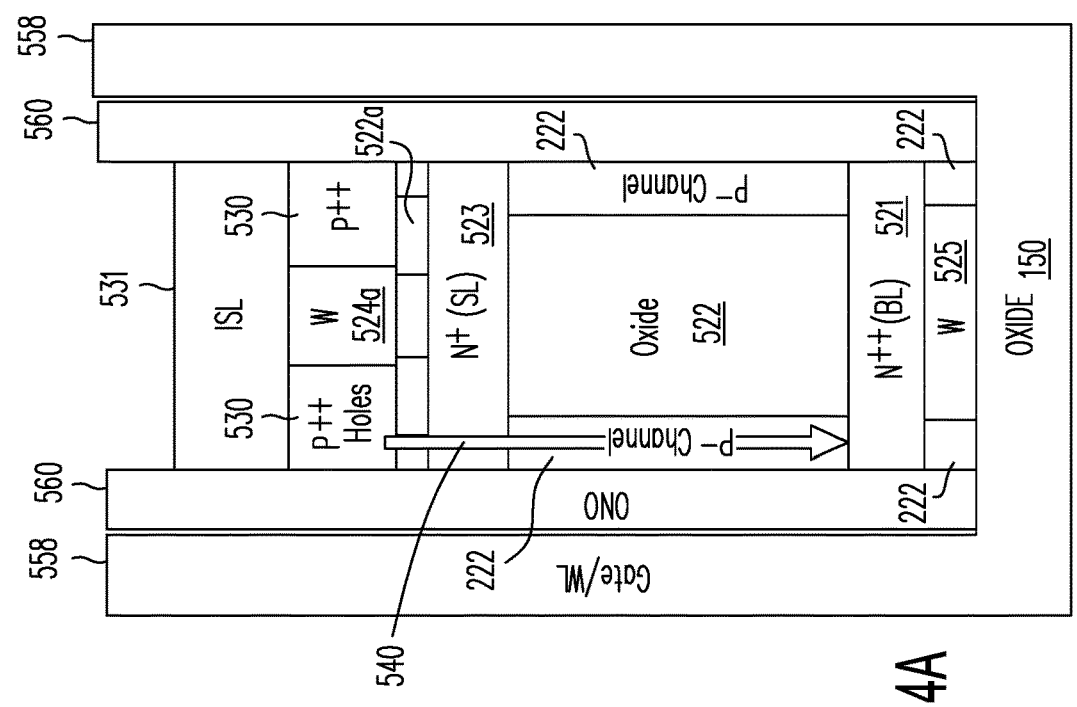
Figures: 4A and 4B: Embodiments to provide holes to depleted P-channel to facilitate efficient erase operations

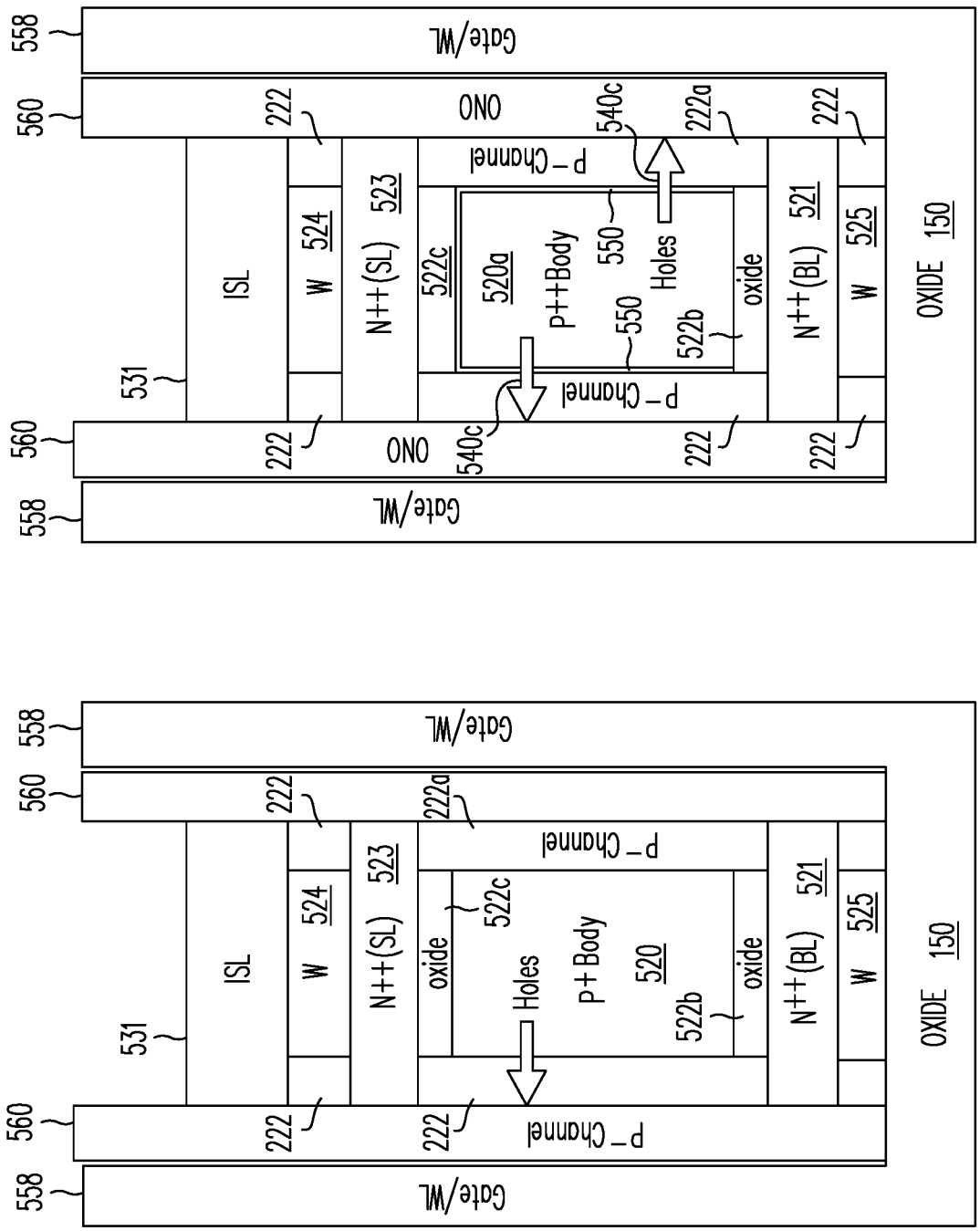
Figures: 4C and 4D: Embodiments to provide holes to depleted P-channel to facilitate efficient erase operations

DEVICE STRUCTURE FOR A 3-DIMENSIONAL NOR MEMORY ARRAY AND METHODS FOR IMPROVED ERASE OPERATIONS APPLIED THERETO

CROSS REFERENCE TO RELATED APPLICATIONS

The present application is related to and claims priority of U.S. provisional patent application ("Provisional Application I"), Ser. No. 62/697,060, entitled "Device Structure for a 3-Dimensional NOR Memory Array and Methods for Improved Erase Operations Applied Thereto," filed on Jul. 12, 2018.

The present application relates to (i) U.S. provisional patent application ("Provisional Application II"), Ser. No. 62/522,666, entitled "Replacement Metal and Strut for 3D Memory Array", filed on Jun. 20, 2017; and (ii) U.S. provisional patent application ("Provisional Application III"), Ser. No. 62/550,553, entitled "3-Dimensional NOR Memory Array Architecture and Methods for Fabrication Thereof," filed on Aug. 25, 2017. (iii) U.S. patent application ("Non-provisional Application I"), Ser. No. 15/846,766, entitled "Multi-gate NOR Flash Thin-film Transistor Strings Arranged in Stacked Horizontal Active Strips with Vertical Control Gates," filed on Dec. 19, 2017, now published as U.S. 2018/0108423; (iv) U.S. patent application ("Non-provisional Application II"), Ser. No. 15/837,734, entitled "Three-Dimensional Vertical NOR Flash Thin-film Transistor Strings," filed on Dec. 11, 2017, now published as U.S. 2018/0108416; and (v) U.S. patent application ("Non-provisional Application III"), Ser. No. 15/248,420, entitled "Capacitive-coupled Non-volatile Thin-film Transistor Strings in Three-Dimensional Arrays," filed on Aug. 26, 2016, now published as U.S. 2017/0092371. The disclosures of Provisional Applications I, II and III, and Non-provisional Applications I, II and III (collectively, the "Related Applications") are hereby incorporated by reference in their entireties.

References herein to Non-Provisional Applications I, II and III are made by paragraph numbers of their respective publications.

BACKGROUND OF THE INVENTION

1. Field of the Invention

The present invention relates to memory structures providing non-volatile memory strings. In particular, the present invention relates to structure modifications to improve erase or program operation performance in a 3-dimensional structure containing such non-volatile memory strings, e.g., NOR-type memory strings.

2. Discussion of the Related Art

The lightly-doped channel region of a thin-film transistor in a high-density 3-dimensional memory structure, such as any of those described in the Provisional Applications II and III, has only a small number of donor or acceptor sites and may become depleted of charge carriers (i.e., holes or electrons) under normal biasing conditions during read, program and erase operations. Unlike non-volatile memory transistors fabricated on bulk silicon, non-volatile thin-film memory transistors (e.g., those disclosed in the Related Applications) have floating channels and therefore suffer from a limited supply of donor or acceptor sites. During an erase operation, the gate, source and drain bias conditions of an NMOS thin-film memory transistor may completely deplete the floating channel region of electrons, so that there are insufficient number of holes to accumulate at the surface of the channel region, thereby leading to a slow erase operation.

SUMMARY

The present invention provides one or more sources of holes in close proximity to a floating $P^-$ channel region of a thin-film storage transistor to facilitate a more efficient erase operation.

According to one embodiment of the present invention, a thin-film storage transistor includes (a) first and second semiconductor layers (e.g., polysilicon) of a first conductivity serving, respectively, as a source terminal and a drain terminal of the thin-film storage transistor; (b) a third semiconductor layer of a second conductivity, adjacent both the first and second semiconductor layers, serving as a channel region of the thin-film storage transistor; (c) a conductor serving as a gate terminal of the thin-film storage transistor; and (d) a charge-trapping structure including, for example, an oxide-nitride-oxide (ONO) multi-layer separating the gate conductor from the channel region. In the ONO charge-trapping structure, a charge-trapping nitride layer is separated from the conductor by a first blocking dielectric layer and from the third semiconductor layer by a second tunnel dielectric layer. The third semiconductor layer may have a dopant concentration greater than $1.0 \times 10^{18}$ cm$^{-3}$ or it may be undoped. This channel region may be made sufficiently thin, typically in the range of 3-15 nm, with its dopant concentration sufficiently low to facilitate its complete depletion when the thin-film storage transistor is biased to a non-conducting state. In some embodiments, the third semiconductor layer may comprise polysilicon or another semiconductor material (e.g., germanium, silicon germanium, recrystallized silicon, or indium gallium zinc oxide (also called "Igzo"). In one embodiment, the third semiconductor layer (i.e., the channel material) is formed inside a recess of an insulation layer. A shallow recess (e.g., 3-15 nm deep) can conveniently accommodate a depletable thin channel region. In addition, in some embodiments, a fourth semiconductor layer of the second conductivity ("a body layer") having a dopant concentration that is at least that of the third semiconductor layer may be included in direct or indirect contact with the channel region. The fourth semiconductor layer's primary function is to provide free charge carriers to the channel region, so as to speed up device operations such as an erase operation. To increase the number of free charge carriers, the body layer may have a dopant concentration that is one or more orders of magnitude greater than the dopant concentration of the channel material. In such an embodiment, care must be taken to ensure that the dopants in the body layer are prevented from excessively doping any channel region adjacent to the body layer. Dopant redistribution may be avoided by exposing the memory structure to prolonged high temperature steps in the manufacturing process or, alternatively, by providing a thin dielectric diffusion barrier film, typically just a few nanometers thick, to separate the channel region from the body region. In one embodiment, the body region is adjacent to an ONO multi-layer. In another embodiment, the body layer is substantially separated from the ONO multi-layer by the channel region, so as to avoid or reduce the higher dopant concentration of the body layer from unduly impacting the threshold voltage of the thin-film storage transistor.

Alternatively, the charge-trapping structure may include a thin tunneling dielectric film (e.g., a silicon oxide layer, a nitrogen-rich silicon oxide, or a silicon oxide-silicon nitride-silicon oxide ("ONO") triple-layer) that is bandgap-engineered, as is known to those of ordinary skill in the art). The thin tunneling dielectric film is preferably 3 nm or less, and is followed after its deposition by a deposition of a 3-10 nm thick layer of charge-trapping material (e.g., silicon nitride, silicon-rich nitride or oxide, nanocrystals, nanodots embedded in a thin dielectric film, or isolated floating gates), then followed by a blocking dielectric film. The blocking dielectric film may be a 4-15 nm thick layer consisting of, for example, an ONO layer, or a high dielectric constant film (e.g., aluminum oxide, hafnium oxide or some combination thereof with silicon oxide). The charge-trapping structure may also include SONOS, TANOS, nanodot storage, isolated floating gates or any suitable charge-trapping structures known to those of ordinary skill in the art.

Thin-film storage transistors of the present invention may be organized as a NOR memory string, in which the thin-film storage transistors share the common source and drain regions, provided by the first and second semiconductor layers, respectively.

In one embodiment, a conductive material is provided as part of a staircase or inverse staircase structure to electrically connect the body layer to either the common source or drain layers or regions. In one embodiment, the conductive material is provided at a connection region of a memory structure where the body layers of the NOR memory strings of the memory structure are connected to circuitry formed in or on a semiconductor substrate using a staircase structure or an inverse staircase structure. The conductive structure may include a silicide, such as a nickel silicide, a cobalt silicide or a tungsten silicide, another silicide, or a refractive metal (e.g., tungsten, tantalum or cobalt). Alternatively, the conductive material may be a polysilicon spacer with a dopant concentration of $1.0 \times 10^{19}$ cm$^{-3}$ or higher.

According to one embodiment of the present invention, a channel region of the second conductivity type has a higher than conventional dopant concentration, so as to provide sufficient donors or acceptors to facilitate erase or program operations. For example, thin-film storage transistor of the present invention may have a mean intrinsic threshold voltage between 1.5 to 6.0 volts, or higher. An erase operation may optionally be used to bring the thin-film storage transistor to a state in which its threshold voltage is below the intrinsic threshold voltage, and during programming the device is programmed substantially back to its intrinsic threshold voltage.

According to some embodiments of the present invention, an added P-doped body layer or P-doped region provides sufficient electrical carriers (i.e., holes for NMOS thin-film transistors and electrons for PMOS thin-film transistors) to the channel region, when the channel region is otherwise completely depleted under electric field conditions applied to the source, the drain and the gate regions. For example, a p$^-$ channel region (e.g., lightly boron doped) of a non-volatile NMOS thin-film transistor with a floating channel (i.e., no direct electrical connection to the P-doped silicon substrate) may be depleted of electrons during an erase operation, when the gate terminal is biased at a high negative voltage relative to the source and drain terminals, and there are very few holes in the lightly doped channel region. In that situation, the more heavily P-doped body layer or P-doped region provides additional holes to the channel region to facilitate the erase operation. Therefore, the P doped body or the P-doped layer of a floating thin film transistor serves the function of a P-doped bulk silicon substrate of a conventional non-volatile NMOS transistor.

The present invention is better understood upon consideration of the detailed description below, in conjunction with the accompanying drawings.

Figure 2C:
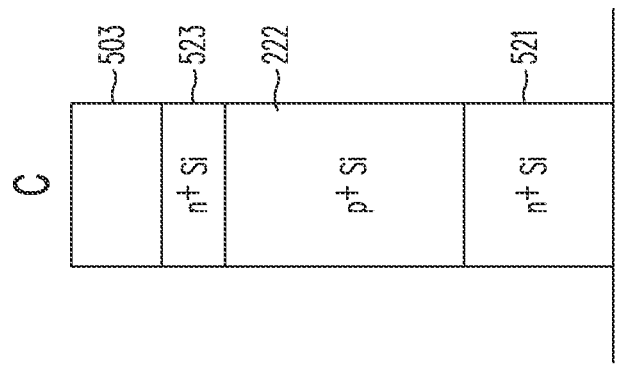
Figure 2B:
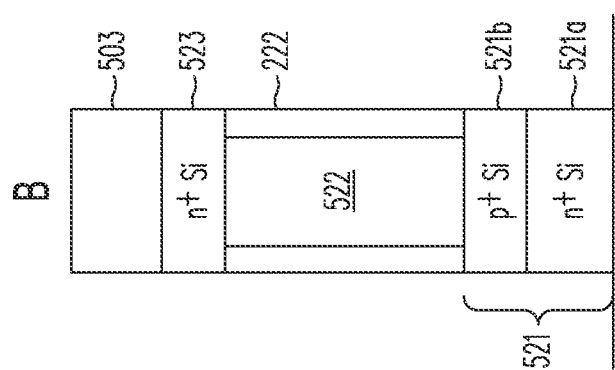
Figure 2A:
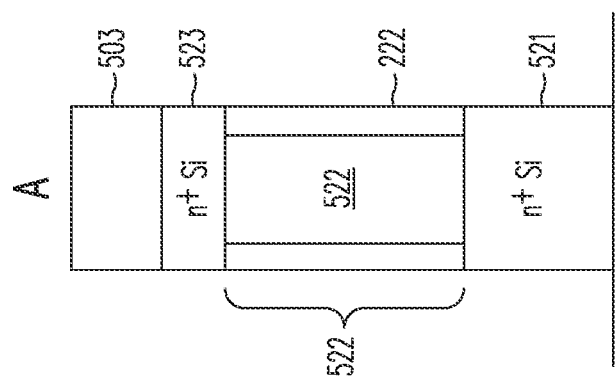

In accordance with the embodiments of the present invention described therein, FIGS. 2A, 2B & 2C each illustrate, schematically, an improved device structure of a pair of side-by-side thin-film storage transistors in a NOR memory string that may be formed using the processes taught, for example, in Provisional Application III. In order to simplify the accompanying description, the charge trapping layers, gate conductors, and the low-resistivity conductors that are strapped to the common N+ source and drain layers are omitted.

Figure 2D:
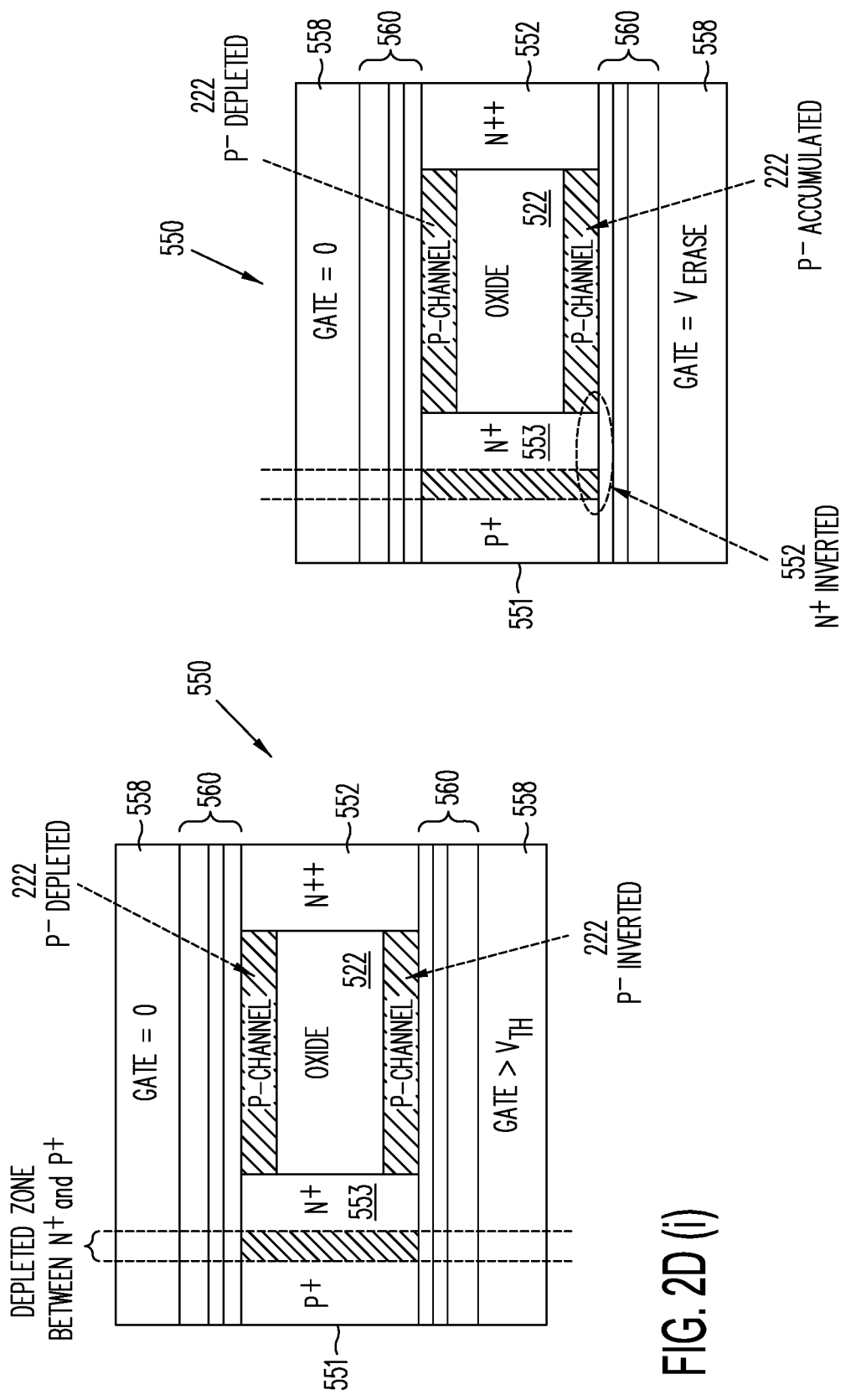

FIGS. 2D(i) and 2D(ii) illustrate schematically, another improved device structure 550 of the thin-film storage transistors in a NOR memory string, in accordance with one embodiment of the present invention.

Figure 3A:
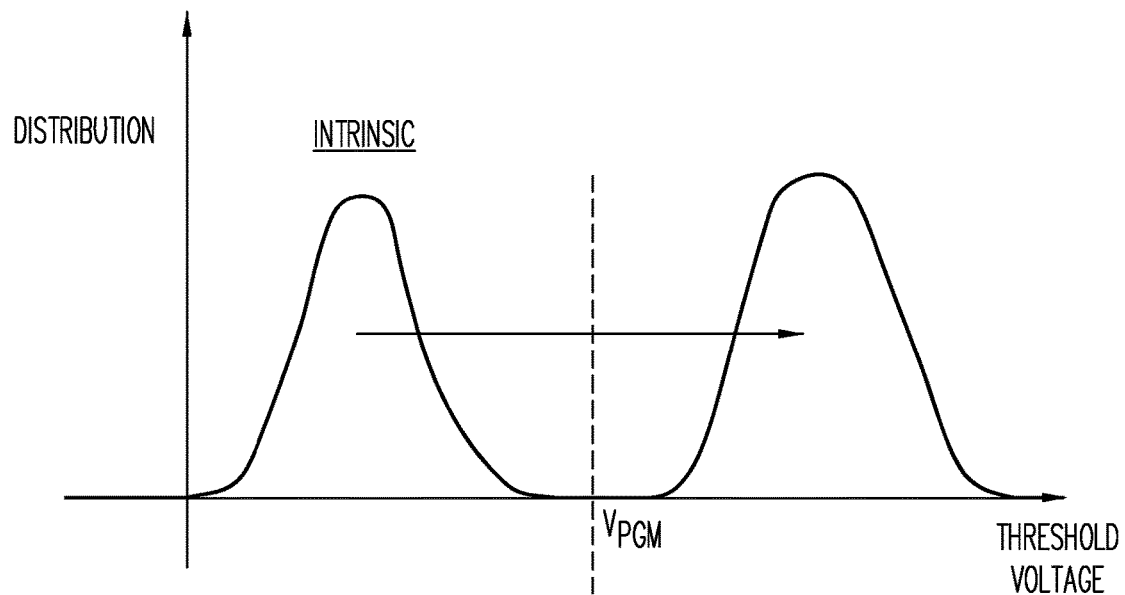

FIG. 3A shows that, at a boron dopant concentration of $1.0 \times 10^{18}$ cm$^{-3}$, the intrinsic threshold voltage is around 2.0 volts, so that a programmed state may be set at a higher voltage than the intrinsic threshold voltage.

Figure 3B:
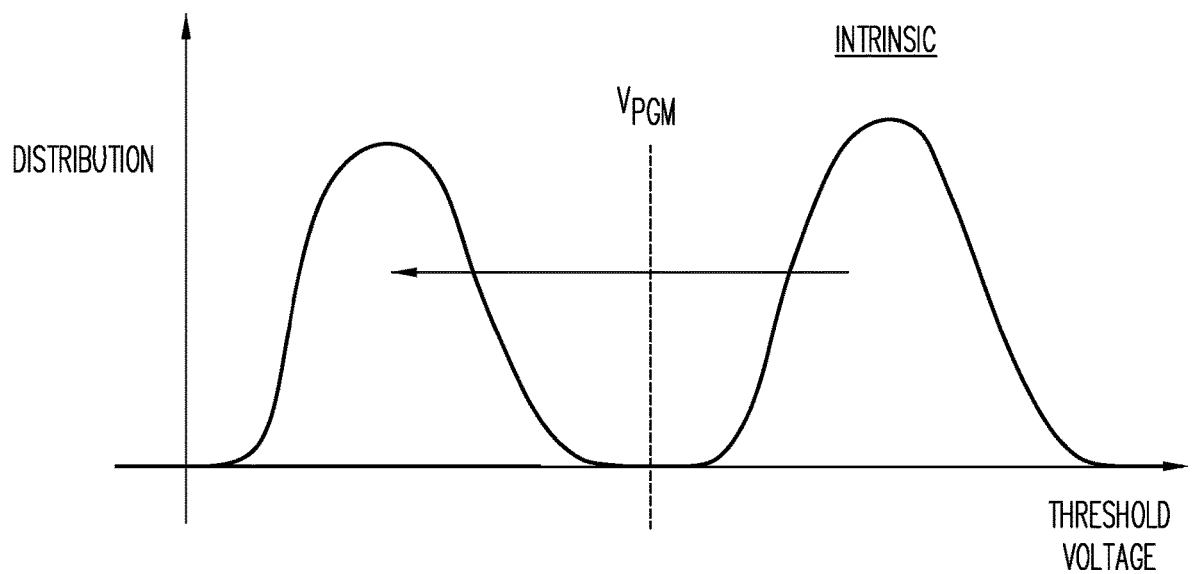

FIG. 3B shows that, at a boron dopant concentration greater than $1.0 \times 10^{18}$ cm$^{-3}$, where the mean intrinsic threshold voltage is 3.0-6.0 volts, the programmed state can be designated as the state having a threshold voltage that is lower than the intrinsic mean threshold voltage state (which normally would be designated as the "erased" state).

FIGS. 4A, 4B, 4C & 4D each illustrate, according to one embodiment of the present invention, embedding a P-doped semiconductor strip (or a P-doped semiconductor body) within the structure of thin film storage transistors to provide a supply of holes during an erase operation in a selected transistor.

Figure 5:
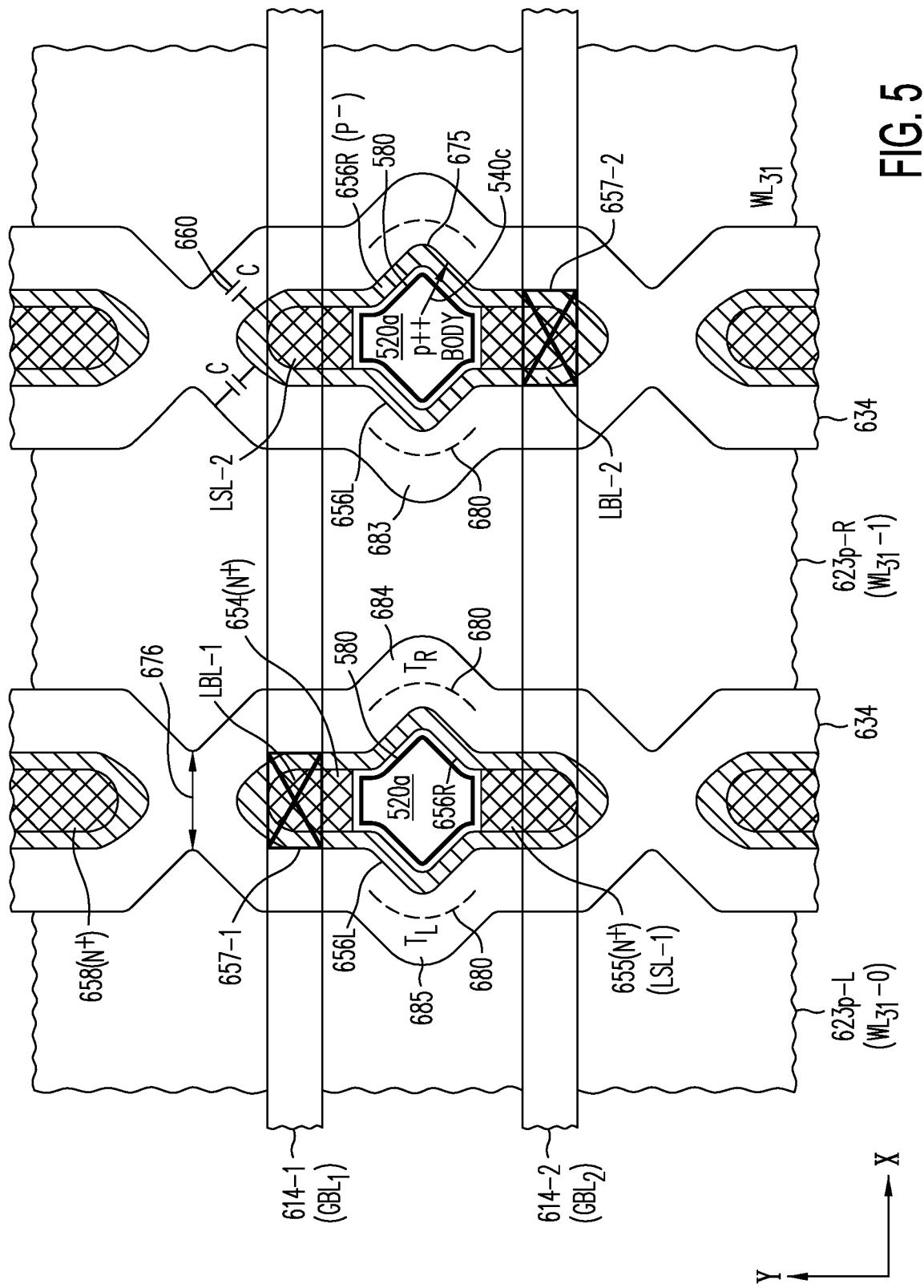

FIG. 5 shows storage transistors 684 and 685 of one or more vertical NOR memory strings, in accordance with one embodiment of the present invention.

To simplify the following detailed description, like elements in the drawings are assigned like reference numerals. The figures, although drawn for clarity of illustration, are not drawn to scale.

DETAILED DESCRIPTION OF THE PREFERRED EMBODIMENTS

The present invention provides one or more sources of holes in close proximity to a floating P$^-$ channel in a thin-film storage transistor in order to facilitate a more efficient erase operation. One way to supply excess holes to a channel region to facilitate erase is by generating holes using the well-known GIDL mechanism (GIDL is the acronym for "gate-induced drain leakage current"). Although it is a relatively slow mechanism (typically a few milliseconds), GIDL is employed extensively in 3-D NAND memory structures to generate holes in the channel region during an erase operation. GIDL bias conditions can be employed equally well to generate excess holes during an erase operation for the thin-film transistors disclosed in the Related Applications. The GIDL mechanism can be applied whether erasing an entire thin-film transistor string or individually selected thin-film transistors.

Another way to facilitate an erase operation is to connect the P⁻ channel regions of the thin-film transistor string to a bulk P-type substrate, which has essentially unlimited supply of holes. For example, in paragraph [0072] and in FIG. 3, Non-provisional Application I discloses providing optional connection 290 to P⁻ sublayers 222 to access back-bias voltage $V_{bb}$, from substrate 201. There, paragraph [0072] teaches: " . . . In some embodiments a high positive $V_{bb}$ voltage can be applied during an erase operation to tunnel-erase TFTs whose control gates are held at ground potential . . . ." Similarly, in FIG. 5 and paragraph [0054], Non-provisional Application II teaches: " . . . buried contact 556 optionally connects P⁻ body region on the active strip to body bias source 506 ($V_{bb}$) in the substrate . . . ." Connecting the P⁻ channels to the bulk P substrate is a viable source of excess holes for erasing a vertical NOR thin film transistor string but is somewhat more complicated to implement with a horizontal NOR thin film transistor string.

Various embodiments of the present invention are described generally herein. After the various embodiments are described, some specific examples of materials and fabrication steps are described that can be applied to forming the various embodiments.

In this detailed description, the term "patterning" refers to (i) providing a masking layer (e.g., a photoresist layer or a hard mask layer) over the target layer, and (ii) creating a pattern in the masking layer using suitable photolithography techniques. The pattern created in the masking layer is typically transferred to one or more target layers using one or more etching steps.

Figure 1:
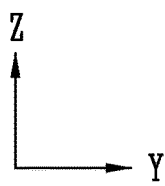
FIG. 1 shows a cross-sectional view of various material layers along the Y-direction (which is parallel to the planar surface of the semiconductor substrate) in memory structure 500, according to one embodiment of the present invention.

In this detailed description, memory structures and methods of fabricating the memory structures over a semiconductor substrate are described as illustrative examples of the present invention. Prior to forming the memory structure, various devices and circuitry are formed on or in the semiconductor substrate using conventional techniques. One or more layers of individually addressed conductors may be provided to connect bit lines and other electrical elements of the memory structure to devices or circuitry on or in the semiconductor substrate and may be formed beneath or above the memory structure. The layers of conductors are insulated from each other by a dielectric material, which is provided between the conductors and between the layers of conductor. The surface of the dielectric is then planarized using, for example, chemical-mechanical polishing (CMP), known to those skilled in the art. In FIG. 1, described below, this planarized surface is represented by the surface of dielectric layer 201. In this description, to facilitate description of the 3-dimensional memory structure, the surface of dielectric layer 201 defines an X-Y plane—X and Y being mutually orthogonal directions parallel to the surface of dielectric layer 201—and the direction perpendicular to the X-Y plane defines the Z direction.

FIG. 1 shows a Y-Z cross-sectional view of various material layers in memory structure 500, according to one embodiment of the present invention. In FIG. 1, active layers 502-0 to 502-7 are provided, each active layer including drain sublayer 521, source sublayer 523 and sacrificial material 1 ("SAC1") sublayer 522 (to be subsequently partially or completely replaced by a channel sublayer). In addition, sacrificial material 4 (SAC4) sublayer 524 is provided, to be subsequently replaced by a conductive sublayer which electrically contacts drain sublayer 521 throughout substantially its entire length. Sacrificial material 4 can also be provided (not shown) adjacent to source layers 523 to be also subsequently replaced by a conductor sublayer which electrically contacts portions of, or substantially the entire length of, source sublayer 523. The conductive sublayer replacing sacrificial material 4 provides a low-resistivity path for its adjacent source or drain sublayer. Initially, the material layers of memory structure 500 are deposited over the entire surface of planarized dielectric layer 201.

Deep trenches are then etched in the material layers (e.g., lengthwise along the Y direction and along the Z direction in depth to buried contacts in dielectric layer 201, or even through dielectric layer 201 to expose conductors in dielectric layer 201 to contacts formed on the surface of the semiconductor substrate, or both) to form individual stacks of the material layers ("active stacks") separated from each other along the X direction. In each active stack, each active layers form a strip of material layers ("active strip"). FIG. 1 may represent, for example, a cross section in the Y-Z plane through an active stack. Storage transistors are then formed out of each active strip in each active stack along one or both side walls of the active strip. The storage transistors may be organized as multiple NOR memory strings each extending along the Y direction. To form the storage transistors, among other steps, (i) sacrificial sublayer 522 is recessed along its length in the Y direction, or completely excavated, so that a lightly-doped polysilicon may be deposited to fill the resulting void, thus forming channel regions that are in contact with the common source and drain regions (ii) a charge-trapping material (e.g., an ONO multi-layer) is provided over each sidewall of the active stacks in the deep trenches, (iii) gate terminals ("word lines") are formed as conductor columns in the trenches, each extending along the Z directions and arrayed side-by-side along the Y direction. Each storage transistor of the NOR memory string is thus formed by (i) a common source region, provided by source sublayer 523 of an active strip, (ii) a common drain region ("bit line"), provided by drain sublayer 521 of the active strip, (iii) a channel region, provided by a portion of the lightly-doped polysilicon in the recess or excavated cavity of sacrificial layer 522, (iv) a charge trapping material (e.g., an ONO multi-layer), and (v) a gate terminal, provided by one of the conductor columns. As would be understood by one of ordinary skill in the art, the source and drain regions are interchangeable with each other—i.e. region 523 can serve as the drain region and region 521 can serve as the source region.

Various processes may be used, such as those disclosed in Provisional Applications II and III, illustrate various exemplary ways to form the NOR memory strings of the memory structure. For example, FIGS. 3-11 and 12A-12D of Provisional Application III, in conjunction with the description of the specification therein, illustrate a process that forms NOR memory strings that extend along a direction (e.g., Y direction) parallel to the surface of a semiconductor substrate.

FIGS. 2A-2C illustrate schematically, in accordance with embodiments of the present invention, improved device structures of the thin-film storage transistors in a NOR memory string that may be formed, with slight modifications, using the processes taught in Provisional Application III, for example. In FIGS. 2A-2C, the charge trapping material (e.g., an ONO multi-layer), the gate terminals, and the conductor layers (e.g., conductor layer 524 illustrated in FIG. 1) strapping source layer 523 and drain layer 521 are not shown for reasons of highlighting only features in focus; these omitted elements; however, are understood to be present and required for proper device operations. In the device structures of FIG. 2A, a P⁻ doped polysilicon material 222 is provided as a channel material in the recessed portions of sacrificial sublayer (SAC1) 522.

In a conventional polysilicon thin-film transistor, the boron dopant concentration in the channel region is typically around $10^{18}$ (e.g., $1.0 \times 10^{17}$ cm$^{-3}$-$1.5 \times 10^{18}$ cm$^{-3}$), which provides a mean threshold voltage ("mean intrinsic threshold voltage") of 1.5-2.0 volts, with the corresponding charge-trapping material being uncharged. Increasing the thickness of the channel material (e.g., to greater than 10 nm) both widens the spread of the threshold voltage distribution in both the programmed and erased state and weakens the "macaroni" effect[1] known to a person of ordinary skill in the art.

[1] The "macaroni" effect refers to the substantial reduction in the parasitic subthreshold leakage current of the transistor when the channel region is sufficiently thin (e.g., 20 nm or less) as to be completely depleted during the transistor's non-conducting state.

In the conventional thin-film transistor, the mean intrinsic threshold voltage is typically less than 2.0 volts, and the programmed state may be set at a higher voltage than 2.0 volts, as illustrated in FIG. 3A. To program a thin-film storage transistor to a programmed state, electrons are injected from an inverted layer of the channel material into the charge-trapping layer or material. As shown in FIG. 3A, when the mean threshold voltage of the programmed state is set sufficiently high, so that the threshold distributions of the programmed and erased states are sufficiently separated, a read-voltage ($V_R$) slightly higher than 2.0 volts may be used to distinguish between the programmed state and the erased state in the thin-film storage transistor.

According to one embodiment of the present invention, polysilicon material 222 of FIG. 2A may be provided a higher boron dopant concentration (e.g., $5.0 \times 10^{18}$ cm$^{-3}$ to $1.0 \times 10^{19}$ cm$^{-3}$) than a conventional thin-film storage transistor. At a boron dopant concentration above around $5.0 \times 10^{18}$ cm$^{-3}$, the mean intrinsic threshold voltage is between 3.0-6.0 volts. An alternative to a programmed state having a mean threshold voltage that is above the mean intrinsic threshold voltage of around 3.0-6.0 volts may be achieved by designating the mean intrinsic threshold voltage as the programmed state and a lower mean threshold voltage state as the erased state, as illustrated in FIG. 3B. As shown in FIG. 3B, erasing a thin-film storage transistor is achieved by bringing the thin-film storage transistor from its intrinsic threshold voltage state to its lower threshold erased state. To bring a thin-film storage transistor to its erased state, electrons are driven out from the charge-trapping region into the channel material or holes are injected from the channel material to the charge-trapping region. A read-voltage ($V_R$) between the two distributions (e.g., $V_R$=1.0 volt below the intrinsic threshold voltage) would distinguish between the erased and programmed states.

In one embodiment, as shown in FIG. 2A, (i) N$^+$ common drain and source regions 521 and 523 may each be 40 nm thick along the vertical or Z direction, (ii) sacrificial layer 522 may be 80 nm thick (along the Z-direction) about 30 nm wide (along a horizontal or X-direction), (iii) P-doped polysilicon 222 may be 9.0-13.0 nm thick (along the horizontal or X direction), and (iv) the number of thin-film storage transistors along the Y direction in each NOR memory string may be 1000 or more. Each NOR memory string is isolated from other NOR memory strings above or below it by interlayer dielectric 503. When P-doped polysilicon 222 has a boron dopant concentration of $1.0 \times 10^{19}$ cm$^{-3}$ and its thickness along the Z-direction is greater than the depleted region of a PN junction, it is estimated 40 free charge carriers may be available in the channel region of each thin-film storage transistor, so that the total free charge carriers in the shared channel regions of the NOR memory string approximate 40,000, contributing to an enhanced erase efficiency. In some embodiments, one or both of common drain and source regions 521 and 523 may also include a 30 nm sacrificial layer 524, which may be replaced by a high conductivity layer (e.g., tungsten (W)) prior or subsequent to deposition of P-doped polysilicon 222.

FIG. 2B shows, in one embodiment of the present invention, N$^+$ common drain sublayer 521 being implemented as N$^+$ sublayer 521a and P$^-$ sublayer 521b, each being about 20 nm thick, with P-doped sublayer 521b to be adjacent and in contact with P-doped polysilicon 222 to supply additional free charge carriers to the channel region of the storage transistor being erased. P$^+$ sublayer 521b may have the same or higher boron dopant concentration as P$^-$-doped polysilicon layer 222 (e.g., $1.0 \times 10^{19}$ cm$^{-3}$). In such a configuration, each thin-film storage transistor would have 920 free charge carriers in the channel region, with a total of 920,000 free carriers per NOR memory string. However, although P$^+$ layer 521b aids in the erase operation, a high boron concentration or an excessive thickness may hinder the formation of a continuous inverted channel between the source region (i.e., N$^+$ polysilicon) 523 and the drain region (N$^+$ polysilicon 521a) in a read operation. Care must also be taken to avoid excessive diffusion of dopants between N$^+$ polysilicon 521a and P$^+$ polysilicon 521b during any high temperature manufacturing processing step. Such cross diffusion can be mitigated considerably by depositing or growing an ultra-thin dopant diffusion-blocking dielectric (not shown), typically 1-3 nm thick silicon oxide or silicon nitride between N$^+$ polysilicon 521a and P$^+$ polysilicon 521b (see below).

FIG. 2C shows, in one embodiment of the present invention, sacrificial layer 522 being completely replaced by P-doped polysilicon body 520 (e.g., with a boron dopant concentration of up to around $1.0 \times 10^{19}$ cm$^{-3}$). In this configuration, the macaroni effect is diminished and the native threshold voltage is quite high (e.g. 3.0-6.0 volts), but each thin-film storage transistor would have 9000 free charge carriers (holes) in the channel region, for a total of 9 million or more free charge carriers in the channel regions of the NOR memory string.

FIGS. 2D(i) and 2D(ii) illustrate schematically, another improved device structure 550 of the thin-film storage transistors in a NOR memory string, in accordance with one embodiment of the present invention. In device structure 550, P$^+$ layer 551 is separated from sacrificial layer 522 by N$^+$ common source layer 553. As in each of the device structures of FIGS. 2A-2B, sacrificial layer 522 is recessed or excavated at a subsequent step and filled by an undoped or P$^-$-doped material 222 (e.g., boron, at $1.0 \times 10^{17}$ cm$^{-3}$ to around $1.5 \times 10^{18}$ cm$^{-3}$), which serves as a channel material in the completed device. In FIG. 2D(i), for a reason to be discussed below, N$^+$ common source region 553 has a lower dopant concentration (e.g., arsenic, at $1.0 \times 10^{18}$ cm$^{-3}$ to $1.0 \times 10^{19}$ cm$^{-3}$) than N$^{++}$ common drain layer 552 (e.g., $1.0 \times 10^{20}$ cm$^{-3}$). P$^+$ layer 551 has a dopant concentration (e.g., boron, at $1.0 \times 10^{18}$ cm$^{-3}$ to $1.0 \times 10^{19}$ cm$^{-3}$) that is approximately equal to the dopant concentration of N$^+$ common source layer 553. A depletion layer 570 naturally forms between P$^+$ layer 551 and N$^+$ common source layer 553. As in the devices in FIGS. 2A-2C discussed above, the material layers of device structure 550 may be formed by layer-by-layer depositions, using the processes of Provisional Applications II and III. FIG. 2D(i) also shows the charge-trapping layers 560 and gate electrodes 558, provided on the side walls of device structure 550 and adjacent charge-trapping layers 560, respectively.

A thin-film storage transistor having device structure 550 of FIG. 2D(i), as shown, has a mean intrinsic threshold voltage of typically less than 2.0 volts. Such a device may be programmed to threshold voltages higher than 2.0 volts. During a read operation, gate electrode 558 is biased to a read voltage slightly above the device's threshold voltage (e.g., 2.0 to 4.0 volts). During a programming operation, the voltage at gate electrode 558 is set to a relatively high value (e.g., 10.0 to 15.0 volts), while N$^+$ common source layer 553, P$^+$ layer 551 and the N$^+$ common drain layer 552 are biased at or near the ground reference voltage. In that configuration, the surface of undoped or P$^-$ material at the interface with charge-trapping material 560 (e.g., an ONO multi-layer) is inverted (i.e., becomes N-type conductivity) to provide a conduction path between N$^+$ common source layer 553 and N$^+$ common drain layer 552. In both reading and programming operations, the inverted N-type conductivity layer ends on N$^+$ common source layer 553 and the P$^+$ layer 551 is isolated and does not affect the device operation of the thin-film storage transistor.

FIG. 2D(ii) illustrates device structure 550 of FIG. 2D(ii) during an erase operation. As shown in FIG. 2D(ii), during the erase operation, gate electrode 558 is biased to a relatively large negative value (e.g., between −15.0 and −10.0 volts), while N$^+$ common source layer 553, P$^+$ layer 551 and N$^+$ common drain layer 552 are biased at a low voltage (e.g., the ground reference voltage). In this configuration, electrons at the surface of N$^+$ common source layer 553 and undoped or P$^-$ layer 222, are driven away, so that the surface of N$^+$ common source layer 553 at the interface with charge-trapping material 560 (e.g., an ONO multi-layer) becomes inverted (i.e., P-type conductivity) and the surface of undoped or P$^-$ layer 222 at the interface with charge-trapping layer 560 becomes accumulated. In this configuration, charge carriers (e.g., holes) are supplied from P$^+$ layer 551 to undoped or P$^-$ layer 222 to facilitate the erase operation. The same effect may be achieved, for example, with the voltage at gate electrode 558 set to or near ground voltage, while N$^+$ common drain layer 552, N$^+$ common source layer 553 and P$^+$ layer 551 are biased to a high positive voltage (e.g., 10.0-15.0 volts).

The present invention is applicable not only in providing efficient erase operations in the horizontal NOR memory strings in the various embodiments discussed herein and in the Non-provisional Applications I and III, it is also applicable to improving erase efficiency in the vertical NOR memory strings, for example, disclosed in Non-provisional Application II. For example, in FIG. 6a and paragraph [0056], Non-provisional Application II discloses storage transistors TFT 685 (T$_L$) and TFT 584 (T$_R$) of the same or a pair of vertical NOR strings, storage transistor having a P$^-$-doped polysilicon layer (656L or 656R) channel region between N$^+$ common source line 655 and N$^+$ common drain line 654. The channel regions (i.e., P$^-$-doped polysilicon layers 656L and 656R are provided on the surface of a dielectric core (i.e., isolation material 640). The present invention may be incorporated into the storage transistors of vertical NOR memory strings, as illustrated in FIG. 5.

As illustrated by FIG. 5, instead of providing isolation material 640, in situ boron-doped P$^{++}$ region 520a is provided as a P$^+$ body to supply holes to P$^-$ channel layers 656L and 656R. In FIG. 5, an ultra-thin diffusion barrier layer 550 is also provided to prevent out-diffusion of dopants from P$^{++}$ region 520 to P$^-$ channel regions 656L and 656R. Under the bias conditions of an erase operation, the holes supplied from P$^{++}$ region 520 to R channel regions 656L or 656R draw electrons trapped in charge trapping layer 634 to direct-tunnel out (as indicated by arrow 540c) into depleted P$^-$ doped channel 656R or 656L. Note that, all storage transistors of a NOR memory string may be erased in parallel, if desired. (Storage transistors may be inhibited from erase by providing their gate electrodes a non-erase bias voltage or left floating).

In fact, the localized P$^+$ body region of the present invention can be similarly applied to vertical 3-D NAND-type memory structures to enhance erase efficiency in NAND series transistors sharing a vertical P$^-$ channel layer ("NAND memory string"). Normally, the holes at the center of a conventional memory structure for a vertical NAND memory string has a cylindrical dielectric core with a thin polysilicon P$^-$ channel (e.g., 6-9 nm) provided on its surface. The dielectric core may comprise an oxide, a nitride or air). At that thickness, the P$^-$ channel takes advantage of the macaroni effect seen with fully depleted P$^-$ channel along the full height of the NAND memory string. In such a structure, holes may be generated, for example, using a GIDL biasing technique using designated transistors provided at the top or bottom (or both) of the memory structure. The holes thus generated make their way through the entire length of the highly resistive P$^-$ channel, which is a rather inefficient process that can require milliseconds to completely erase the storage transistors of the NAND memory string. (In other conventional 3-D NAND memory strings, a P$^-$ body is provided instead of the dielectric core; however, while the P$^-$ body facilitates hole movements along the length of the memory structure, the advantages of the macaroni effect is sacrificed, as it is difficult to completely deplete the P$^-$ body. However, providing a P$^+$ body and an appropriate diffusion barrier layer to protect the P$^-$ channel region in place of the dielectric core or the P$^-$ body in such a memory structure, the present invention provides 3-D memory structure for NAND memory strings that can greatly improve erase efficiency.

The advantages of the present invention are numerous. For example, as shown above with respect to the examples of FIGS. 4A-4D and 5, merely by providing an additional P-doped layer or a P-doped body—which can be conveniently provided by an in situ boron-doped polysilicon or silicon germanium at a low temperature (e.g., no greater than 500° C.)—a thin P$^-$-doped polysilicon layer can be used as channel material with its numerous attendant advantages, such as the macaroni effect. With a bit line-channel junction limited to the 10 nm or less thickness of P$^-$ doped channel material, bipolar leakage current is well-contained. Further, by providing ultra-thin diffusion barrier layer (e.g., diffusion barrier layers 522a and 522b), dopant out-diffusion from N$^+$ common source or common drain regions would not contaminate the P-doped body. Further, using the alternative step of recessing a P-doped body layer, an adverse impact on mean threshold voltage in the resulting thin-film storage transistor may be avoided. Also, by careful design of dopant profiles in the N$^+$ common drain and source regions (e.g., arsenic) and in P-doped body (e.g., boron), short channel effects-may be avoided.

The above detailed description is provided to illustrate specific embodiments of the present invention and is not intended to be limiting. Numerous modifications and variations within the scope of the present invention are possible. The present invention is set forth in the accompanying claims.

We claim:

1. A thin-film storage transistor in a memory string, comprising:
   first and second semiconductor layers of a first conductivity, serving as a drain terminal and a source terminal of the thin-film storage transistor, respectively;
   a third semiconductor layer of a second conductivity adjacent the first and second semiconductor layers, serving as a channel region of the thin-film storage transistor;
   a conductor serving as a gate terminal of the thin-film storage transistor;
   a charge-trapping region between the conductor and third semiconductor layer;
   a fourth semiconductor layer of the second conductivity provided in close proximity to the third semiconductor layer and having a dopant concentration substantially equal to or great than the dopant concentration of the third semiconductor layer and
   a diffusion barrier layer that prevents dopant diffusion between the third and fourth semiconductor layer.

2. The thin-film storage transistor of claim 1, wherein when the gate, source and drain terminals of the storage transistor are electrically biased for a programming operation or an erase operation, the fourth semiconductor region provides excess donors or acceptors to the channel region.

3. The thin-film storage transistor of claim 1, wherein the first, second, third and fourth semiconductor layers are selected from a group consisting of silicon, silicon-germanium, germanium, and any combination thereof.

4. The thin-film storage transistor of claim 1, wherein the fourth semiconductor layer comprises in situ boron-doped polysilicon deposited by low pressure chemical vapor deposition with concentration not less than $1.0 \times 10^{18}$ cm$^{-3}$.

5. The thin-film storage transistor of claim 1, wherein the fourth semiconductor layer is shared by two or more transistors in the memory string.

6. The thin-film storage transistor of claim 5, wherein the memory string comprises a NOR memory string.

7. The thin-film storage transistor of claim 1, wherein the memory string is part of a memory structure fabricated on a semiconductor substrate, and wherein the fourth semiconductor layer is electrically connected to circuitry in the semiconductor substrate.

8. The thin-film storage transistor of claim 7, wherein the conductor electrically connects both the second and fourth semiconductor layers.

9. The thin-film storage transistor of claim 1, wherein the first semiconductor layer being greater in dopant concentration than both the second and the fourth semiconductor layers.

10. The thin-film storage transistor of claim 1, wherein the charge-trapping region comprises an oxide-nitride-oxide multi-layer.

11. The thin-film storage transistor of claim 1, wherein the third semiconductor layer is formed inside a recess of a dielectric layer.

12. The thin-film storage transistor of claim 1, further comprising a second diffusing barrier layer that prevents dopant diffusion between the fourth semiconductor layer and the first semiconductor layer or the second semiconductor layer.

13. The thin-film storage transistor of claim 1, wherein the diffusion barrier layer is less than 4 nm thick.

14. The thin-film storage transistor of claim 13, wherein the diffusion barrier layer comprises one or both of a silicon oxide and a silicon nitride.

15. The thin-film storage transistor of claim 13, wherein the fourth semiconductor region serves as a body region of the thin-film storage transistor, and wherein excess donors or acceptors are provided by the body region to the channel region.

16. The thin-film storage transistor of claim 15, wherein the donors or acceptors are provided through a tunneling mechanism.

17. The thin-film storage transistor of claim 16, wherein the second conductivity is P-type, and wherein the acceptors tunneled from the body region draw electrons from the charge trapping-region during an erase operation.

18. The thin-film storage transistor of claim 15, wherein the third semiconductor layer is accommodated in recesses formed in the fourth semiconductor layer.

19. The thin-film storage transistor of claim 1, wherein the memory string comprises a vertical memory string in which the body region is provided by a vertical semiconductor structure rising from a planar surface of a semiconductor substrate, and wherein a voltage source is formed in the semiconductor substrate and wherein the body region is biased from the voltage source.

20. The thin-film storage transistor of claim 1, wherein the memory string comprises a horizontal memory string formed along an active strip comprising the first, second, third and fourth semiconductor layers in the active strip, wherein the active strip further comprises a diffusion barrier in contact with both the fourth semiconductor layer and the second semiconductor layer preventing dopant diffusion therebetween.

21. The thin-film storage transistor of claim 20, wherein the second and fourth semiconductor layers each have a dopant concentration at $(1.0 \pm 0.5) \times 10^{19}$ cm$^{-3}$.

22. The thin-film storage transistor of claim 21, wherein the active strip further comprises a conductor layer in contact with the fourth semiconductor layer.

23. The thin-film storage transistor of claim 22, wherein the conductor layer of the active strip is in contact with the second semiconductor layer through an opening in the diffusion barrier layer.

24. The thin-film storage transistor of claim 21, wherein the fourth and the second semiconductor layers provide transistor action to supply excess donors or acceptors from the to the channel region of the thin-film storage transistor.

25. The thin-film storage transistor of claim 24, wherein a portion of the second semiconductor layer is inverted to P-type conductivity during an erase operation.

26. The thin-film storage transistor of claim 20, wherein the fourth semiconductor layer is also adjacent both the first and third semiconductor layers and wherein at least one portion of the third semiconductor layer is adjacent the fourth semiconductor layer, such that the fourth semiconductor region forms a body region of the thin-film storage transistor.

27. The thin-film storage transistor of claim 1, wherein the memory string comprises a NAND memory string.

28. The thin-film storage transistor of claim 1, wherein the memory string comprises a NOR memory string.

29. The thin-film storage transistor of claim 1, wherein an erase operation on the thin-film storage transistor is achieved by setting (i) a first voltage on the gate terminal, (ii) a second voltage on both the first and second polysilicon layers, wherein the second voltage is greater than the first voltage.

30. The thin-film storage transistor of claim 29, wherein the first voltage is less than the second voltage by greater than the 10.0 volts.

31. The thin-film storage transistor of claim 1, wherein the fourth semiconductor layer has a dopant concentration between $1.0\times10^{19}$ cm$^{-3}$ to $1.0\times10^{21}$ cm$^{-3}$.

32. The thin-film storage transistor of claim 1, wherein the first semiconductor layer has a dopant concentration between $1.0\times10^{19}$ cm$^{-3}$ to $1.0\times10^{21}$ cm$^{-3}$.

33. The thin-film storage transistor of claim 1, wherein the fourth semiconductor layer has a dopant concentration between $1.0\times10^{18}$ cm$^{-3}$ to $1.0\times10^{19}$ cm$^{-3}$.

34. The thin-film storage transistor of claim 1, wherein the third semiconductor layer has a thickness no greater than 20 nm.

35. The thin-film storage transistor of claim 34, wherein the third semiconductor layer has a dopant concentration greater than $1.0\times10^{18}$ cm$^{-3}$.

36. The thin-film storage transistor of claim 1, wherein thin-film storage transistor has an intrinsic threshold voltage between 3.0 to 6.0 volts.

37. The thin-film storage transistor of claim 36, wherein an erase operation brings the thin-film storage transistor to a state in which its threshold is below the intrinsic threshold voltage.

38. The thin-film storage transistor of claim 1, wherein the first conductivity is N-type and the second conductivity is P-type.

* * * * *